United States Patent
Tanada et al.

(10) Patent No.: US 9,577,209 B2
(45) Date of Patent: Feb. 21, 2017

(54) LIGHT-EMITTING DEVICE AND MANUFACTURING METHOD THEREOF, LIGHTING DEVICE, AND DISPLAY DEVICE

(75) Inventors: Yoshifumi Tanada, Tochigi (JP); Naoya Sakamoto, Tochigi (JP); Hiroki Adachi, Tochigi (JP); Shingo Eguchi, Kanagawa (JP); Koji Ono, Tochigi (JP); Kensuke Yoshizumi, Kanagawa (JP); Hiroto Shinoda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/367,833

(22) Filed: Feb. 7, 2012

(65) Prior Publication Data
US 2012/0205700 A1    Aug. 16, 2012

(30) Foreign Application Priority Data
Feb. 10, 2011    (JP) .................................. 2011-027602

(51) Int. Cl.
H01L 51/52    (2006.01)
H01L 51/56    (2006.01)
H01L 27/32    (2006.01)

(52) U.S. Cl.
CPC ....... H01L 51/5212 (2013.01); H01L 27/3279 (2013.01); H01L 51/5228 (2013.01); *H01L 2251/5361* (2013.01)

(58) Field of Classification Search
CPC .................................................... H01L 51/52
USPC ...... 257/98, 431; 438/29; 313/503, 504, 506
See application file for complete search history.

(56) References Cited

U.S. PATENT DOCUMENTS

| 6,037,712 | A  | * | 3/2000 | Codama et al. | ............... 313/498 |
| 6,222,315 | B1 |   | 4/2001 | Yoshizawa et al. | |
| 6,280,861 | B1 |   | 8/2001 | Hosokawa et al. | |
| 6,306,559 | B1 |   | 10/2001 | Tanamura et al. | |
| 6,538,374 | B2 | * | 3/2003 | Hosokawa | .................... 313/504 |

(Continued)

FOREIGN PATENT DOCUMENTS

| CN | 101340754 A | 1/2009 |
| EP | 1 648 032 A2 | 4/2006 |

(Continued)

OTHER PUBLICATIONS

International Search Report for WO application PCT/JP2012/052568, mailing date Apr. 3, 2012.

(Continued)

*Primary Examiner* — Mohsen Ahmadi
*Assistant Examiner* — Ismail Muse
(74) *Attorney, Agent, or Firm* — Husch Blackwell LLP

(57) ABSTRACT

The present invention focuses on a structure in which an auxiliary wiring for increasing the conductivity of an upper electrode is provided on the substrate side. The conductive auxiliary wiring of a light-emitting device is provided over a substrate, and an upper portion of the auxiliary wiring protrudes in a direction parallel to the substrate. Further, an EL layer formed in a region including a lower electrode layer and the auxiliary wiring is physically divided by the auxiliary wiring. An upper electrode layer formed in a manner similar to that of the lower electrode layer may be electrically connected to at least part of a side surface of the auxiliary wiring. Such an auxiliary wiring may be used in a lighting device and a display device.

15 Claims, 11 Drawing Sheets

(56) References Cited

U.S. PATENT DOCUMENTS

| | | | |
|---|---|---|---|
| 7,161,184 B2 | 1/2007 | Miyagi et al. | |
| 7,633,218 B2* | 12/2009 | Cok | 313/503 |
| 7,737,629 B2 | 6/2010 | Okuyama et al. | |
| 7,834,543 B2 | 11/2010 | Takata | |
| 7,888,864 B2 | 2/2011 | Young | |
| 7,943,938 B2 | 5/2011 | Miyagi et al. | |
| 7,948,164 B2 | 5/2011 | Bae et al. | |
| 7,999,463 B2 | 8/2011 | Nomura | |
| 8,003,417 B2 | 8/2011 | Li et al. | |
| 8,237,159 B2 | 8/2012 | Li et al. | |
| 2003/0060055 A1 | 3/2003 | Kamijima | |
| 2004/0051097 A1* | 3/2004 | Ishikawa et al. | 257/40 |
| 2005/0140285 A1* | 6/2005 | Park | H01L 27/3246 |
| | | | 313/506 |
| 2006/0055999 A1* | 3/2006 | Bae et al. | 359/245 |
| 2006/0220544 A1 | 10/2006 | Okuyama et al. | |
| 2007/0120465 A1* | 5/2007 | Ito | G02F 1/133555 |
| | | | 313/504 |
| 2007/0252266 A1* | 11/2007 | Koo | H01L 27/3265 |
| | | | 257/701 |
| 2008/0116788 A1 | 5/2008 | Yamazaki et al. | |
| 2008/0224606 A1 | 9/2008 | Kawai et al. | |
| 2008/0286445 A1 | 11/2008 | Suzuki et al. | |
| 2009/0009069 A1* | 1/2009 | Takata | 313/504 |
| 2009/0058278 A1 | 3/2009 | Ushikubo et al. | |
| 2009/0153046 A1 | 6/2009 | Hayashi et al. | |
| 2010/0117523 A1 | 5/2010 | Tchakarov | |
| 2010/0277403 A1* | 11/2010 | Chao et al. | 345/80 |
| 2010/0301326 A1 | 12/2010 | Miyairi et al. | |
| 2011/0037054 A1 | 2/2011 | Shieh et al. | |
| 2011/0089814 A1 | 4/2011 | Nomura | |
| 2011/0089823 A1 | 4/2011 | Nomura | |
| 2011/0101388 A1 | 5/2011 | Nomura | |
| 2011/0140617 A1 | 6/2011 | Nomura | |
| 2011/0210335 A1 | 9/2011 | Miyagi et al. | |
| 2012/0161165 A1 | 6/2012 | Yamazaki | |
| 2012/0161166 A1 | 6/2012 | Yamazaki | |
| 2012/0161167 A1 | 6/2012 | Yamazaki | |
| 2012/0161174 A1 | 6/2012 | Yamazaki | |
| 2012/0205678 A1 | 8/2012 | Ikeda et al. | |
| 2012/0206036 A1 | 8/2012 | Tanaka et al. | |

FOREIGN PATENT DOCUMENTS

| | | |
|---|---|---|
| JP | 11-214161 A | 8/1999 |
| JP | 2005-235491 | 9/2005 |
| JP | 2008-135325 | 6/2008 |
| JP | 2009-32673 | 2/2009 |
| JP | 2009-130132 | 6/2009 |
| JP | 2009-266803 | 11/2009 |
| KR | 10-2009-0004672 | 1/2009 |
| TW | I285516 B | 8/2007 |
| TW | 201041430 | 11/2010 |
| WO | WO 2004/044987 A2 | 5/2004 |

OTHER PUBLICATIONS

Written Opinion of the International Searching Authority for WO application PCT/JP2012/052568, mailing date Apr. 3, 2012.

Taiwanese Office Action re Application No. TW 101103380, dated Dec. 24, 2015.

* cited by examiner 107 105  117    103

107 105   117 103 119

107 105   117 103 119

109  165  103 101

167

111

LIGHT-EMITTING DEVICE AND MANUFACTURING METHOD THEREOF, LIGHTING DEVICE, AND DISPLAY DEVICE

TECHNICAL FIELD

The present invention relates to a light-emitting device and a manufacturing method thereof. Further, the present invention relates to a lighting device and a display device.

BACKGROUND ART

An organic EL element has been actively researched and developed. In the fundamental structure of the organic EL element, a layer containing a light-emitting organic compound is interposed between a pair of electrodes. By applying voltage to this element, light emission from the light-emitting organic compound can be obtained.

The organic EL element can be formed into a film shape; thus, a large-area element can easily be formed. Therefore, the organic EL element has a high utility value as a surface light source that can be applied to lighting or the like.

For example, a lighting device including an organic EL element is disclosed in Patent Document 1.

Further, a display device in which an organic EL element and a thin film transistor are combined has been actively developed. A display device including an organic EL element does not need a backlight which is necessary for a liquid crystal display device, so that a reduction in thickness and an increase in luminance and contrast can be achieved.

As for an organic EL element, there are a bottom emission type in which light emission is extracted to a lower electrode layer side, a top emission type in which light emission is extracted to an upper electrode layer side, and a dual emission type in which light emission is extracted to a lower electrode layer side and an upper electrode layer side.

Reference

Patent Document

[Patent Document 1] Japanese Published Patent Application No. 2009-130132

DISCLOSURE OF INVENTION

As the area of a light-emitting portion in a lighting device or a display device having a large screen increases, a potential drop due to the resistance of an upper electrode or a lower electrode of an EL element tends to be significant. In the case where a potential drop in the electrodes is significant, there is a problem in that unevenness in luminance might be seen. In order to prevent such a problem, an auxiliary wiring formed using a material having low resistivity needs to be connected to the electrodes.

In particular, a light-transmitting material which is used for a transparent electrode has relatively high resistance; therefore, a demand for providing an auxiliary wiring is high. The auxiliary wiring should be provided so that the auxiliary wiring blocks as little light emitted from an EL element as possible. However, particularly in the case of a top emission type (including a dual emission type) in which light emission is extracted to an upper electrode layer side, the auxiliary wiring needs to be formed after formation of an EL element; accordingly, the EL element might be damaged in some cases. For example, in the case where processing is performed by a photolithography method after a conductive film is formed by a sputtering method, thermal and physical damage caused by the sputtering method, optical and thermal damage caused by the photolithography method, melting of the EL element due to an organic solvent or the like in removal of a resist, or the like can be given.

As a method for stacking a layer containing an organic compound and an upper electrode in that order over a lower electrode formed over a substrate having an insulating surface in forming an EL element, a vacuum evaporation method is given, for example. As a method for forming an island-shaped layer using a vacuum evaporation method, a method using a metal mask (also referred to as a shadow mask), which is a metal plate provided with an opening, is known. The metal mask is provided between a substrate and an evaporation source to be in contact with the substrate, and evaporation is performed on the substrate through the opening in the metal mask, whereby a layer having a shape in accordance with the shape of the opening can be formed. Note that when the distance between a metal mask and a substrate is short, an island-shaped layer can be formed with a clear shape based on an opening; in other words, a shape whose periphery is less obscure.

In other words, a layer formed using a metal mask must have an island shape because the layer is formed along an opening portion of the mask. That is, a long continuous shape or a shape including a loop portion, like a wiring pattern, is hard to form.

The probability of the occurrence of problems becomes high when a metal mask is used in contact with a substrate. For example, a surface of the substrate is damaged by an edge of an opening portion in the metal mask in some cases. Specifically, at the time of making the metal mask to be in contact with the substrate, the metal mask rubs the surface of the substrate, so that another layer, which is already formed on the substrate, is broken in some cases. Further, dust attached to the metal mask (including a small foreign substance referred to as a particle) is transferred from the metal mask to the substrate in some cases.

The present invention is made in view of the foregoing technical background. Therefore, an object of an embodiment of the present invention is to provide a highly reliable light-emitting device in which a potential drop due to the resistance of an upper electrode is suppressed. Further, another object is to provide a highly reliable light-emitting device in which an EL layer and an upper electrode can be formed without a metal mask. Furthermore, still another object is to provide a lighting device and a display device, in each of which such a light-emitting device is used.

An embodiment of the present invention achieves at least one of the above objects.

In order that the above objects may be achieved, the present invention focuses on a structure in which an auxiliary wiring for increasing the conductivity of an upper electrode is provided on the substrate side. The conductive auxiliary wiring of a light-emitting device is provided over a substrate, and an upper portion of the auxiliary wiring protrudes in a direction parallel to the substrate. Further, an EL layer fowled in a region including a lower electrode layer and the auxiliary wiring is physically divided by the auxiliary wiring. An upper electrode layer formed in a manner similar to that of the lower electrode layer may be electrically connected to at least part of a side surface of the auxiliary wiring. Such an auxiliary wiring may be used in a lighting device and a display device.

In other words, a light-emitting device according to an embodiment of the present invention includes a lower electrode layer over a substrate, an auxiliary wiring which is electrically isolated from the lower electrode layer, an EL layer over the lower electrode layer, and an upper electrode layer over the EL layer. The auxiliary wiring has conductivity, and has a shape in which an upper portion protrudes in a direction parallel to the substrate. The upper electrode layer is electrically connected to the auxiliary wiring.

In a light-emitting device according to an embodiment of the present invention, an auxiliary wiring for increasing the conductivity of an upper electrode is formed on the substrate side. The auxiliary wiring is formed to have a shape in which an upper portion protrudes in a direction parallel to the substrate. In other words, the auxiliary wiring is formed so that a contact area of a bottom portion is inside an area projected on the substrate surface. When the auxiliary wiring having such a shape is formed on the substrate side, in the case where an EL layer is formed without a metal mask, the EL layer can be divided by the auxiliary wiring. Further, the upper electrode is formed to be in contact with at least part of a side surface of the auxiliary wiring, so that the upper electrodes which are formed with the auxiliary wiring provided therebetween can be electrically connected through the auxiliary wiring.

With such an auxiliary wiring, a highly reliable light-emitting device in which a potential drop due to the resistance of an upper electrode is suppressed can be provided. Further, an EL layer and the upper electrode layer can be formed without a metal mask.

In an auxiliary wiring in a light-emitting device according to an embodiment of the present invention, there is a space between a side surface of the auxiliary wiring and a line connecting the outermost point in a bottom portion of the auxiliary wiring and the most protruding point in a side portion of the auxiliary wiring.

When the auxiliary wiring has a space between the side surface of the auxiliary wiring and a line connecting the outermost point in a bottom portion of the auxiliary wiring and the most protruding point in a side portion of the auxiliary wiring, formation of an EL layer on the side portion of the auxiliary wiring is suppressed, and thus, the EL layer can be effectively divided.

In a light-emitting device according to an embodiment of the present invention, an upper electrode layer transmits light emitted by an EL layer, and a lower electrode layer reflects the light.

In particular, in a top-emission light-emitting device including an upper electrode including a light-emitting material, the conductivity of the upper electrode can be effectively increased with the use of the auxiliary wiring.

An embodiment of the present invention is a lighting device including the light-emitting device.

The light-emitting device is used in a lighting device, whereby a potential drop due to the resistance of the upper electrode can be suppressed, and the EL layer and the upper electrode can be formed without a metal mask. Thus, the lighting device can have high reliability.

An embodiment of the present invention is a display device including the light-emitting device.

For example, the auxiliary wiring can be used in a display device in which a plurality of pixel portions is provided. Accordingly, a potential drop due to the resistance of an upper electrode can be suppressed and an EL layer and the upper electrode can be formed without a metal mask. Thus, the display device can have high reliability.

A method for manufacturing a light-emitting device, according to an embodiment of the present invention, includes the steps of: forming a lower electrode layer over a substrate; forming a conductive auxiliary wiring whose side portion protrudes in a direction parallel to the substrate; forming an EL layer over the lower electrode layer; and forming an upper electrode layer over the EL layer so that the upper electrode layer is electrically connected to at least part of a side surface of the auxiliary wiring.

By the above manufacturing method, a highly reliable light-emitting device in which an EL layer and an upper electrode layer are formed without a metal mask can be manufactured. Further, since an auxiliary wiring is provided not over the upper electrode but on the substrate side, the EL layer is not damaged in the step of forming the auxiliary wiring; thus, a highly reliable light-emitting device in which a potential drop due to the resistance of the upper electrode is suppressed can be manufactured.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

According to an embodiment of the present invention, a highly reliable light-emitting device in which a potential drop due to the resistance of an upper electrode is suppressed can be provided. Further, a highly reliable light-emitting device in which an EL layer and an upper electrode can be formed without a metal mask can be provided. Furthermore, a lighting device and a display device in each of which such a light-emitting device is used can be provided.

BEST MODE FOR CARRYING OUT THE INVENTION

Figure 1A:
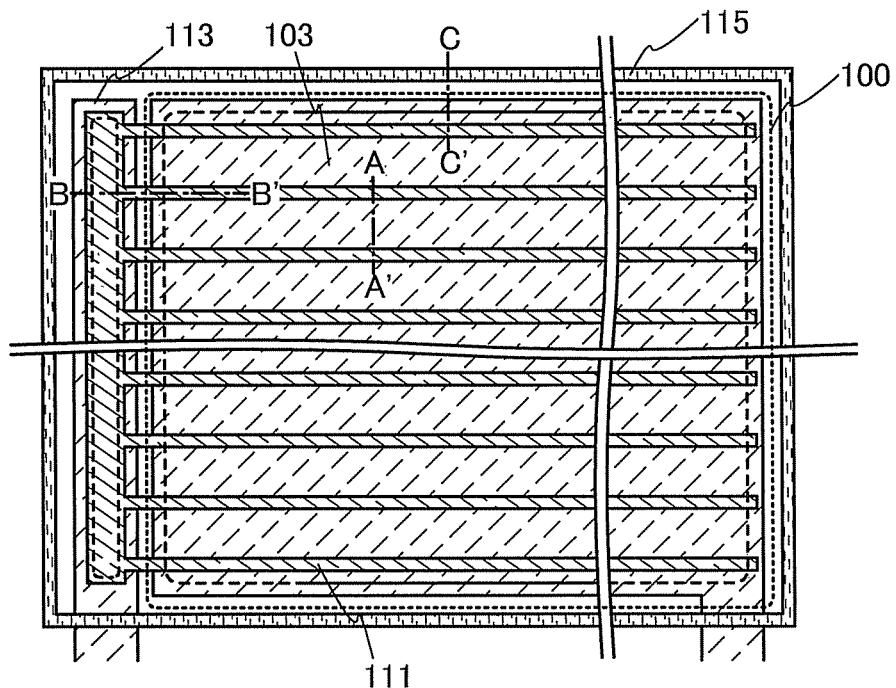
FIGS. 1A to 1C illustrate a light-emitting device according to an embodiment of the present invention.

Embodiments will be described in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, an example of a light-emitting device which is an embodiment of the present invention will be described with reference to FIGS. 1A to 1C, FIG. 2, FIGS. 3A to 3F, and FIGS. 4A to 4C.

STRUCTURAL EXAMPLE

Figure 1B:
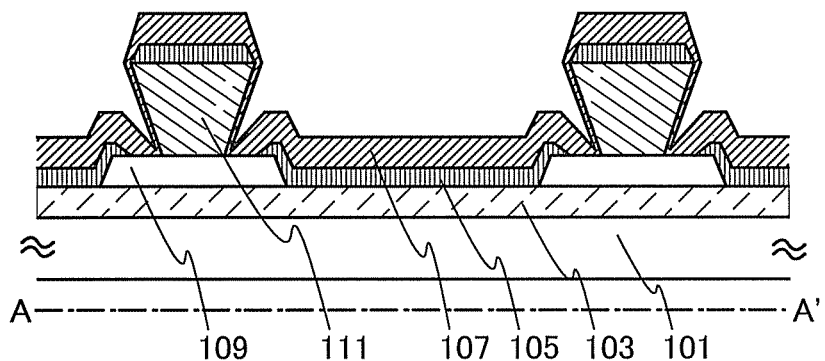
Figure 1C:
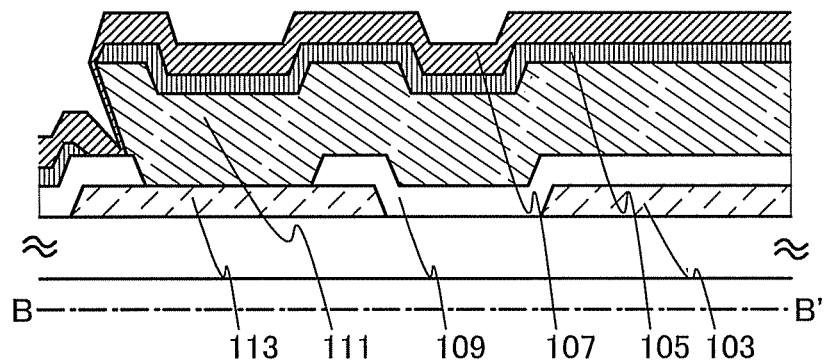

FIG. 1A is a schematic top view of a light-emitting device 100. FIG. 1B is a schematic cross-sectional view taken along line A-A' in FIG. 1A. FIG. 1C is a schematic cross-sectional view taken along line B-B' in FIG. 1A. Note that an EL layer and an upper electrode layer are not illustrated in FIG. 1A for simplicity.

The light-emitting device 100 includes, over a substrate 101, a lower electrode layer 103, a partition 109, an auxiliary wiring 111, an EL layer 105, and an upper electrode layer 107. Further, a wiring 113 which is connected to the auxiliary wiring 111 and a separation layer 115 which surrounds the periphery of the light-emitting device 100 are provided.

Although not illustrated, the light-emitting device 100 may include a base film which is in contact with the substrate 101 and a sealing film which covers the upper electrode layer 107. With the base film and the sealing film, deterioration of the EL layer can be suppressed, and thus, the reliability of the light-emitting device 100 can be increased.

In the light-emitting device 100, voltage is applied to a light-emitting element which includes the lower electrode layer 103, the upper electrode layer 107, and the EL layer 105 sandwiched therebetween, so that light emission can be obtained.

The partition 109 is formed over an end portion of the lower electrode layer 103, and below the auxiliary wiring 111. The partition 109 is provided over the end portion of the lower electrode layer 103 so that the EL layer 105 and the upper electrode layer 107 are not broken at the end portion of the lower electrode layer 103. Therefore, the partition 109 preferably has a forward tapered shape so that a film formed thereover is not broken. In the forward tapered shape, a layer gradually increases in thickness from its edge and is in contact with a layer serving as a base in a cross section.

The auxiliary wiring 111 is formed using a conductive material having sufficiently lower resistance than at least a material of the upper electrode layer 107 and is formed over the partition 109 provided over the lower electrode layer 103. An upper portion of the auxiliary wiring 111 protrudes in a direction parallel to the substrate. In other words, when the auxiliary wiring 111 is projected on the surface of the substrate, the area of a region which is in contact with the partition 109 is smaller than the largest projected area and is inside the largest projected area.

The auxiliary wiring 111 having such a shape is provided and the EL layer 105 and the upper electrode layer 107 are formed by methods described later, so that as illustrated in FIG. 1B, the EL layer 105 is divided by the auxiliary wiring 111 and the upper electrode layer 107 is in contact with at least part of a side surface of the auxiliary wiring 111 to be electrically connected to the auxiliary wiring 111.

Accordingly, the upper electrode layer 107 is not electrically disconnected and electrical connection of the upper electrode layer 107 is secured through the auxiliary wiring 111 over the entire light-emitting region of the light-emitting device 100. Further, a potential drop due to the resistance of the upper electrode layer 107 can be suppressed by the auxiliary wiring 111 electrically connected to the upper electrode layer 107.

As illustrated in FIG. 1C, the auxiliary wiring 111 is electrically connected to the wiring 113 provided adjacent to the light-emitting device 100. The wiring 113 can supply a potential to be applied to the upper electrode layer 107. Note that the wiring 113 is formed using the same material and the same step as those of the lower electrode layer 103 in this embodiment; however, the wiring 113 may be formed using a material having sufficiently lower resistance than the upper electrode layer 107 in a different step. Further, the auxiliary wiring 111 may be led outside the light-emitting device 100 to be directly supplied with a potential.

Figure 2:
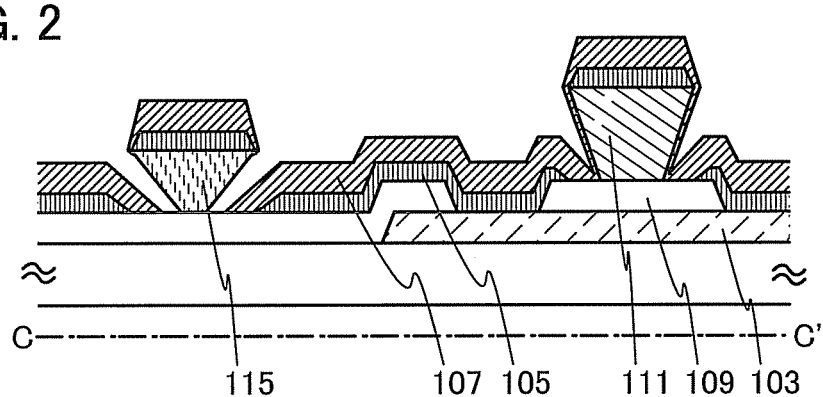
FIG. 2 illustrates a light-emitting device according to an embodiment of the present invention.

FIG. 2 is a schematic cross-sectional view taken along line C-C' in FIG. 1A. The separation layer 115 which is provided so as to surround the light-emitting device 100 divides each of the EL layer 105 and the upper electrode layer 107. When the light-emitting devices 100 are provided adjacent to each other, they can be electrically isolated from each other by the separation layer 115.

The separation layer 115 is formed using an insulating material, and divides both the EL layer 105 and the upper electrode layer 107. As in the auxiliary wiring 111, an upper portion of the separation layer 115 protrudes in a direction parallel to the substrate. In order that both the EL layer 105 and the upper electrode layer 107 may be divided, the separation layer 115 has a shape which does not allow the upper electrode layer 107 to be formed on the side portion of the separation layer 115. For example, the separation layer 115 may be formed so that an angle between the surface of the substrate and a line connecting the most protruding point of the separation layer 115 and a point of a side surface of the separation layer 115 which is in contact with the partition 109 is smaller than an angle between the surface of the substrate and a line connecting the most protruding point of the auxiliary wiring 111 and a point of a side surface of the auxiliary wiring 111 which is in contact with the partition 109. Alternatively, the separation layer 115 may have an inwardly curved shape; that is, a space may be provided between the line and the side surface of the separation layer 115.

The separation layer 115 is not necessarily provided in the case where only one light-emitting device 100 is used or in the case where the adjacent light-emitting devices 100 are not necessarily electrically isolated from each other.

Note that the wiring 113 and the light-emitting device 100 are provided over the substrate 101 in this structural example; however, a planarization film having an opening portion may be formed over the wiring 113 formed over the substrate 101 and the light-emitting device 100 may be provided over the planarization film. The wiring 113 is led below the light-emitting device 100, whereby the light-emitting area with respect to the area of the substrate 101 can be increased.

Such an auxiliary wiring 111 is used in the light-emitting device 100, whereby the EL layer 105 and the upper electrode layer 107 can be formed without a metal mask. Further, with the auxiliary wiring 111 formed using a material having low resistance, an adverse effect of a potential drop due to the resistance of the upper electrode layer 107 can be extremely suppressed and a highly reliable light-emitting device can be provided. In particular, a great effect can be expected in the case of a top-emission light-emitting device including a transparent conductive film having high resistance as the upper electrode layer 107. Further, since the EL layer and the upper electrode layer can be formed without a metal mask, a problem caused due to contact between a metal mask and a substrate does not occur and a highly reliable light-emitting device can be provided.

Further, even in the case where a plurality of the light-emitting devices 100 is provided adjacent to each other, the separation layer 115 is provided to surround each of the light-emitting devices 100 as described above, whereby the light-emitting devices 100 can be electrically isolated from each other when the EL layer 105 and the upper electrode layer 107 are formed without a metal mask.

MODIFICATION EXAMPLE

The auxiliary wiring described above as an example can have various shapes as long as the auxiliary wiring divides the EL layer 105 and is connected to the upper electrode layer 107 so as not to electrically disconnect the upper electrode layer 107. Hereinafter, examples of shapes that the auxiliary wiring can have will be described with reference to FIGS. 3A to 3F.

Figure 3A:
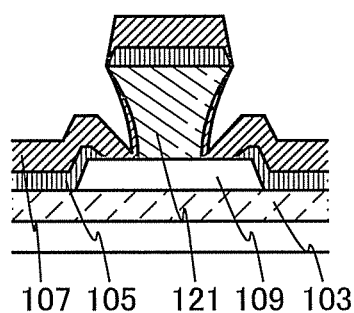
FIGS. 3A to 3F each illustrate a light-emitting device according to an embodiment of the present invention.

In an auxiliary wiring 121 illustrated in FIG. 3A, a side surface thereof curves inward. Particularly in the case where a large amount of a material of the EL layer 105 is deposited on a side portion of the auxiliary wiring in formation, the EL layer 105 can be effectively divided by the auxiliary wiring 121 having such an inwardly curved shape.

Figure 3B:
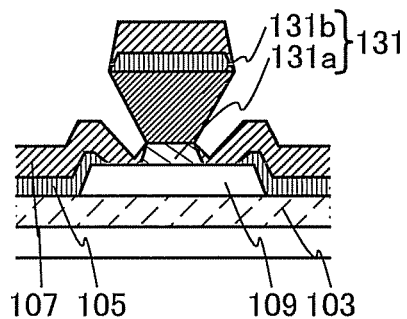

An auxiliary wiring 131 illustrated in FIG. 3B has a stacked structure of a leg portion 131a formed using a conductive material and a stage portion 131b. The region of the leg portion 131a, which is in contact with the partition 109, is inside the most protruding region of the stage portion 131b. The upper electrode layer 107 is not electrically disconnected by being in contact with at least the leg portion 131a. Although the stage portion 131b may have an insulating property, it is preferable to use a conductive material to form the stage portion 131b because the resistance of the auxiliary wiring 131 can be reduced. Further, when the leg portion 131a has a forward tapered shape, the contact area between the upper electrode layer 107 and the leg portion 131a can be large even in the case where a relatively small amount of the material of the upper electrode layer 107 is deposited on a side portion of the stage portion 131b, which is preferable.

Figure 3C:
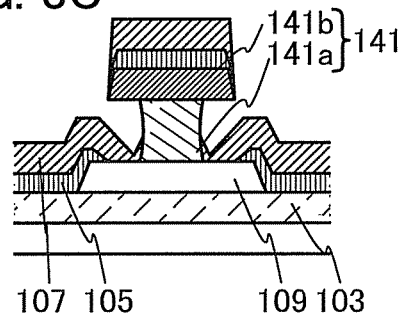

An auxiliary wiring 141 illustrated in FIG. 3C includes, as in the auxiliary wiring 131, a leg portion 141a and a stage portion 141b. Here, in the stage portion 141b, a bottom surface which faces the substrate 101 is partly exposed, so that the EL layer 105 can be more effectively divided. Further, the leg portion 141a may have a forward tapered shape. The upper electrode layer 107 is formed in contact with at least the leg portion 141a. Here, the stage portion 141b may be formed using an insulating material as in the above case; however, a conductive material is preferably used.

Figure 3D:
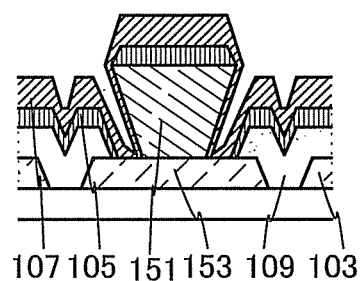

Each of the above auxiliary wirings is not necessarily provided over the partition 109. For example, an auxiliary wiring 151 illustrated in FIG. 3D is formed on and in contact with a wiring 153 which is formed using a material and steps similar to those of the lower electrode layer 103. With such a structure, the resistance of the auxiliary wiring 151 can be further reduced, so that an effect of a potential drop due to the resistance of the upper electrode layer 107 can be extremely reduced. Note that the wiring 153 may be foamed using a material and steps different from those of the lower electrode layer 103. The wiring 153 is preferably formed using a material having low resistance.

Figure 3E:
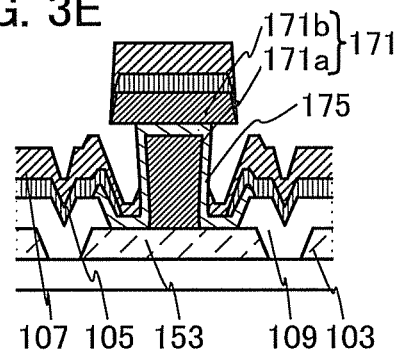
Figure 3F:
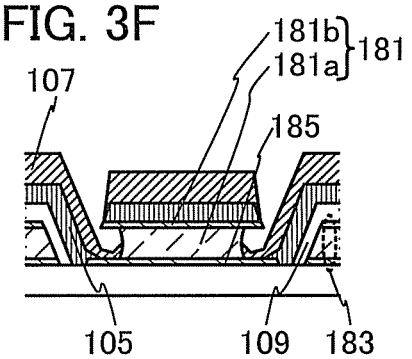

In a structure illustrated in FIG. 3E, an auxiliary wiring 171 is formed over the wiring 153. A connection layer 175 is formed between a leg portion 171a and a stage portion 171b. The connection layer 175 is in contact with an upper surface of the wiring 153 and covers at least a side surface of the leg portion 171a. With such a structure, even when the leg portion 171a and the stage portion 171b are formed using an insulating material such as an organic resin, the connection layer 175 allows part of the side surface of the auxiliary wiring 171 to substantially have conductivity. Here, when the leg portion 171a is formed using an organic resin, the height of the leg portion 171a can be easily increased and thus the upper electrode layer 107 can be easily formed on the side portion of the leg portion 171a; accordingly, contact resistance can be reduced as the contact area between the upper electrode layer 107 and the connection layer 175 increases, which is preferable. Further, in the case where a conductive film forming the wiring 153 is corroded due to contact between a conductive film forming the upper electrode layer 107 and the conductive film forming the wiring 153 (e.g., in the case where ITO (indium tin oxide) and aluminum are used), an adverse effect of the corrosion can be eliminated when the connection layer 175 formed using a conductive film with high affinity with these conductive films is provided between the upper electrode layer 107 and the wiring 153.

Alternatively, an auxiliary wiring may be formed using the same material as a lower electrode layer. In a structure illustrated in FIG. 3F, a lower electrode layer 183 includes three conductive films stacked. For example, when a stacked film in which a conductive film having low resistance is sandwiched between conductive films which are chemically stable (hardly cause reaction and corrosion) is used, conductivity and reliability are increased, which is preferable. An auxiliary wiring 181 is formed using the same conductive films as upper two layers of the lower electrode layer 183. The auxiliary wiring 181 includes a leg portion 181a and a stage portion 181b. Further, the auxiliary wiring 181 is formed over a wiring 185 formed using the same conductive film as the lowermost layer of the lower electrode layer 183. A side surface of the leg portion 181a is positioned inside an end portion of the stage portion 181b. The auxiliary wiring 181 having the above described structure can be formed over the wiring 185, for example, in such a manner that the side surface of the leg portion 181a is recessed by etching utilizing a difference in etching rate of the conductive film forming the leg portion 181a and the conductive films forming the stage portion 181b and the wiring 185. The auxiliary wiring 181 has such a structure, whereby manufacturing steps can be simplified.

The light-emitting device 100 may have a structure in which an auxiliary wiring is also provided for the lower electrode layer 103. In particular, in the case of a bottom-emission (including dual-emission) light-emitting device, a light-transmitting conductive material having relatively high resistance is used for the lower electrode layer 103; therefore, it is effective to provide the auxiliary wiring for the lower electrode layer 103. Also in the case of a top-emission light-emitting device, the resistance of the lower electrode layer 103 cannot be ignored in some cases when the light-emitting area is increased; accordingly, the auxiliary wiring is needed in such a case. Hereinafter, examples of auxiliary wirings provided for the lower electrode layer 103 will be described with reference to FIGS. 4A to 4C.

Figure 4A:
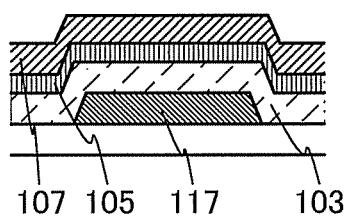
FIGS. 4A to 4C each illustrate a light-emitting device according to an embodiment of the present invention.

In FIG. 4A, an auxiliary wiring 117 is provided in contact with a lower side of the lower electrode layer 103. In such a structure, a region blocking light is only the auxiliary wiring 117 in a bottom emission type; thus, the aperture ratio can be increased. In the case of a top emission type, an area directly above the auxiliary wiring 117 can be a light-emitting region; thus, the aperture ratio is not decreased, which is preferable.

Figure 4B:
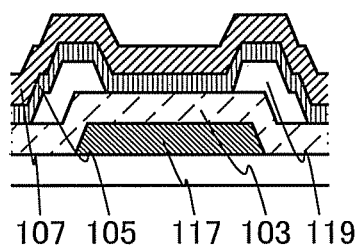
Figure 4C:
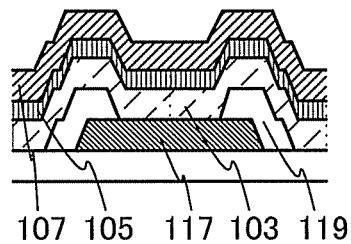

In the case where the EL layer 105 and the upper electrode layer 107 might be disconnected at an end portion of the auxiliary wiring 117, a partition 119 covering the end portion of the auxiliary wiring 117 may be provided. FIG. 4B illustrates a structure in which the partition 119 covering the end portion of the auxiliary wiring 117 is provided in contact with the lower electrode layer 103. A stack of the EL layer 105 and the upper electrode layer 107 is formed in contact with the partition 119 over the end portion of the auxiliary wiring 117, so that disconnection thereof can be prevented. Alternatively, as illustrated in FIG. 4C, the partition 119 may be provided between the auxiliary wiring 117 and the lower electrode layer 103. In particular, when such a structure is used in a top emission type, a region directly above the partition 119 can be a light-emitting region, which is preferable.

Note that only the structures in each of which the auxiliary wiring 117 is provided below the lower electrode layer 103 are described in this embodiment; however, the auxiliary wiring 117 may be provided above the lower electrode layer 103. In that case, the partition 119 may be provided as appropriate in order to reduce an adverse effect of the end portion of the auxiliary wiring 117.

<Material>

Examples of materials used for the respective layers are described below.

[Substrate]

In the case where the light-emitting device 100 is a bottom emission type or a dual emission type, a light-transmitting material such as glass, quartz, or an organic resin can be used as a material of the substrate 101. In the case of a top emission type, a light-transmitting property is not always necessary, and a material such as a metal, a semiconductor, ceramics, and a colored organic resin can be used other than the above materials. In the case where a conductive substrate is used, the substrate preferably has an insulating property by oxidation of its surface or formation of an insulating film over the surface.

In the case where an organic resin is used for the substrate 101, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

In particular, in the case of the top-emission light-emitting device 100, a substrate having high thermal conductivity, such as a metal substrate, is preferably used. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

[Sealing Film and Base Film]

In the case of a bottom-emission or dual-emission light-emitting device, a sealing film and a base film can be formed using a material having a light-transmitting property and a barrier property. In the case of a top-emission light-emitting device, a light-transmitting property is not always necessary.

As each of the sealing film and the base film, an inorganic insulating film can be formed by a sputtering method, for example. For example, a silicon nitride film, an aluminum oxide film, a silicon oxide film, or the like may be formed. The sealing film or the base film which is provided on the side opposite to the direction in which light is extracted may be a stack of a metal film and the above inorganic insulating film.

The sealing film is preferably a gas barrier film in which permeability of moisture is lower than or equal to $10^{-6}$ g/m²·day, for example. A stacked layer structure in which at least one layer containing an inorganic material is provided between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

When an organic resin is used for a substrate, a glass layer with a thickness greater than or equal to 25 μm and less than or equal to 100 μm may be used as a base layer. The thickness of the glass layer is typically greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting device, and the weight of the light-emitting device can be reduced.

[Separation Layer]

A separation layer can be formed using an inorganic insulating material or an organic insulating material. For example, a negative or positive photosensitive resin material, a non-photosensitive resin material, or the like can be used.

[Light-Emitting Element]

As a light-transmitting material which can be used for an electrode layer through which light is extracted, indium oxide, indium tin oxide (ITO), indium zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of the metal material (e.g., titanium nitride) or the like may be used. In the case of using the metal material (or the nitride thereof), the electrode layer may be thinned so as to be able to transmit light. In addition, graphene may be used.

Further, a stacked film of any of the above materials can be used as the electrode layer. For example, when a stacked film of ITO and an alloy of silver and magnesium is used, conductivity can be increased, which is preferable.

The thickness of the electrode layer through which light is extracted is, for example, greater than or equal to 50 nm and less than or equal to 300 nm, preferably greater than or equal to 80 nm and less than or equal to 130 nm, more preferably greater than or equal to 100 nm and less than or equal to 110 nm.

An EL layer includes at least a layer containing a light-emitting organic compound. In addition, the EL layer can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in an embodiment of the present invention, a light-emitting element (a tandem light-emitting element) in which a plurality of EL layers are provided between an upper electrode layer and a lower electrode layer can be used. A stacked-layer structure of two layers, three layers, or four layers (in particular, a stacked-layer structure of three layers) is preferably used. Examples of structures of the EL layer will be described in detail in Embodiment 5.

An electrode layer which is provided on the side opposite to the side from which light is extracted is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

[Auxiliary Wiring and Wiring]

An auxiliary wiring and a wiring can be formed of a single layer or a stacked layer using a material such as copper (Cu), titanium (Ti), tantalum (Ta), tungsten (W), molybdenum (Mo), chromium (Cr), neodymium (Nd), scandium (Sc), or nickel (Ni), or an alloy material containing any of these materials as its main component. Aluminum can also be used for the material of the wiring; however, in that case, the wiring might be corroded when the wiring is provided to be in direct contact with ITO or the like. Therefore, it is preferable that the wiring have a stacked-layer structure and that aluminum be used for a layer which is not in contact with ITO or the like. Copper can be preferably used because of its low resistance. The thickness of the wiring is preferably greater than or equal to 100 nm and less than or equal to 35 µm.

[Partition]

As a material of a partition, for example, an organic resin such as polyimide, acrylic, polyamide, or epoxy or an inorganic insulating material can be used.

The angle of a sidewall surface of a layer whose end portion with a forward tapered shape is in contact with a layer to be a base is greater than or equal to 10° and less than or equal to 85°, preferably greater than or equal to 60° and less than or equal to 80°.

It is particularly preferable that the partition be formed using a photosensitive resin material to have an opening portion so that a sidewall of the opening portion is formed as an inclined surface with continuous curvature. Specifically, the radius of curvature of a curve drawn by a cross section of an insulating film is desirably approximately 0.2 µm to 2 µm.

There is no particular limitation on the method for forming the partition. A sputtering method, an evaporation method, a droplet discharging method (e.g., an inkjet method), a printing method (e.g., a screen printing method or an offset printing method), or the like may be used.

The thickness of the partition may be greater than or equal to 20 nm and less than or equal to 20 µm, for example. The thickness of the partition is preferably greater than or equal to 50 nm and less than or equal to 3 µm.

[Planarization Film]

A planarization film can be formed using an inorganic insulating material or an organic insulating material. Note that a heat-resistant organic insulating material such as an acrylic resin, polyimide, a benzocyclobutene-based resin, polyamide, or an epoxy resin is preferably used as a planarization insulating film. Other than the above organic insulating materials, it is possible to use a low-dielectric constant material (a low-k material), a siloxane-based resin, phosphosilicate glass (PSG), borophosphosilicate glass (BPSG), or the like. Note that the planarization film may be formed by stacking a plurality of insulating films formed using these materials.

A method for forming the planarization film is not particularly limited, and a sputtering method, a spin coating method, a dipping method, a printing method, an inkjet method, or the like can be used depending on the material of the planarization film.

This embodiment can be combined with any of the other embodiments disclosed in this specification as appropriate.

(Embodiment 2)

In this embodiment, an example of a method for manufacturing the light-emitting device 100 described as an example in Embodiment 1 will be described with reference to FIGS. 5A to 5D and FIGS. 6A to 6C.

Note that a top-emission light-emitting device is described as an example of the light-emitting device 100 in this embodiment; however, in the case of a bottom-emission light-emitting device, a light-transmitting material may be used for a lower electrode layer and a reflective material may be used for an upper electrode layer. In the case of a dual-emission light-emitting device, a light-transmitting material may be used for each of the electrode layers.

First, a conductive film to be the lower electrode layer 103 is formed over the substrate 101. The conductive film can be formed using any of the materials described in Embodiment 1 by a film formation method such as a sputtering method or an evaporation method. After that, an unnecessary portion of the conductive film is removed by a processing method such as a photolithography method, so that the lower electrode layer 103 is formed.

Here, a base film may be formed before the lower electrode layer 103 is formed. An insulating film serving as a barrier film can be used as the base film, and can be formed by a film formation method such as a CVD method or a sputtering method.

Alternatively, the lower electrode layer 103 may be formed after a wiring such as the wiring 113 is formed over the substrate 101 and a planarization film covering the wiring 113 is formed. In that case, as in formation of the lower electrode layer 103, the wiring 113 can be formed in such a manner that a conductive film is formed and an unnecessary portion thereof is removed. The planarization film can be formed using a material and a method described in Embodiment 1.

In the case where the auxiliary wiring 117 in contact with the lower electrode layer 103 is provided closer to the substrate than the lower electrode layer 103 is to the substrate, the auxiliary wiring 117 is formed before forming the lower electrode layer 103. As in the lower electrode layer 103, the auxiliary wiring 117 can be formed in such a manner that a conductive film is formed and an unnecessary portion thereof is removed. The partition 119 is formed at this point if necessary.

In the case where the wiring 113 is formed using a material different from the material of the lower electrode layer 103, the wiring 113 is formed before or after the lower electrode layer 103 is formed.

Next, the partition 109 is formed. The partition 109 can be formed using the material and the method described in Embodiment 1 as appropriate.

Figure 5A:
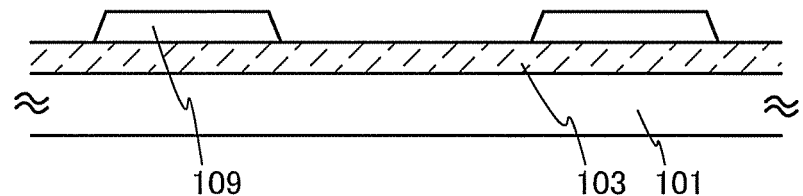
FIGS. 5A to 5D illustrate a method for manufacturing a light-emitting device, according to an embodiment of the present invention.

FIG. 5A is a schematic cross-sectional view of the light-emitting device 100 at this stage.

Next, the auxiliary wiring 111 is formed. Here, the case where the auxiliary wiring 111 is formed using a single layer of a metal is described.

First, a conductive film 161 forming the auxiliary wiring 111 is formed. The conductive film 161 can be formed using any of the materials described in Embodiment 1 by a sputtering method, an evaporation method, or the like.

Figure 5B:
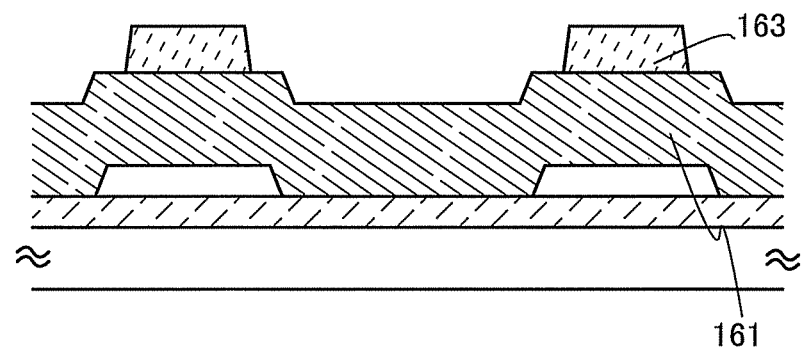

After that, a resist 163 serving as an etching mask is formed over the conductive film 161. The resist 163 can be formed using a known photolithography step in which a photosensitive resin material is applied and light exposure and development are performed. FIG. 5B is a schematic cross-sectional view at this time.

Next, the conductive film 161 is etched with the use of the resist 163 as an etching mask to form the auxiliary wiring 111. At this time, the auxiliary wiring 111, which has been subjected to etching, is formed so that a contact area between the bottom portion of the auxiliary wiring 111 and the partition 109 is smaller than a projected area of the auxiliary wiring 111 on a surface parallel to the substrate 101 and is inside the projected area.

In order that the auxiliary wiring 111 having the above shape is formed by etching of the conductive film 161, for example, after the conductive film 161 is etched by dry etching under the condition that the resist 163 is not etched or that the etching rate of the resist 163 is much lower than that of the conductive film 161, etching time is extended so that the lower portion of the conductive film 161 is etched.

Figure 5C:
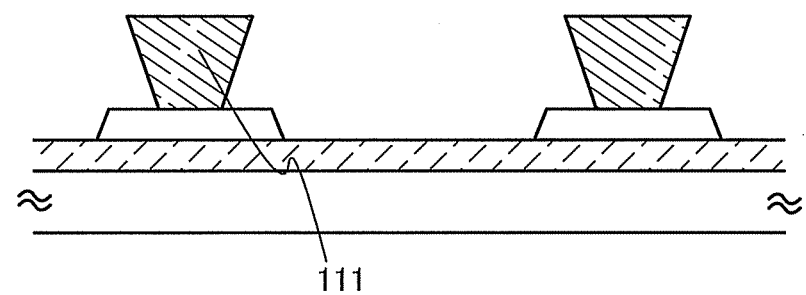

After the auxiliary wiring 111 is formed, the resist 163 is removed. FIG. 5C is a schematic cross-sectional view at this stage.

Here, a method for manufacturing the auxiliary wiring 111, which is different from the above method, is described with reference to FIGS. 6A to 6C.

Figure 6A:
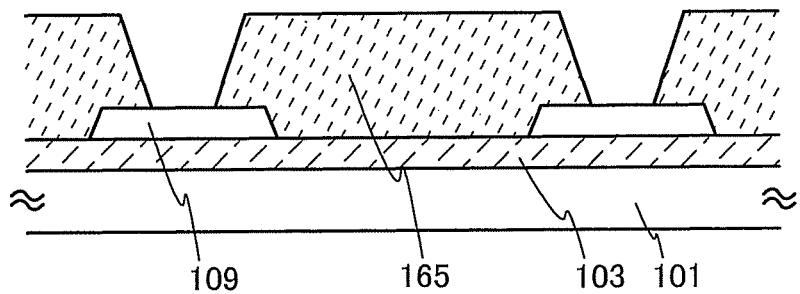
FIGS. 6A to 6C illustrate a method for manufacturing a light-emitting device, according to an embodiment of the present invention.

After formation of the partition 109, a sacrifice layer 165 having an opening in a region where the auxiliary wiring 111 is to be formed is formed (FIG. 6A). At this time, the opening portion in the sacrifice layer 165 preferably has a shape in which the opening portion in the sacrifice layer 165 is smaller in the region closer to the substrate 101. The sacrifice layer 165 may be formed using a photosensitive organic material or the like.

Figure 6B:
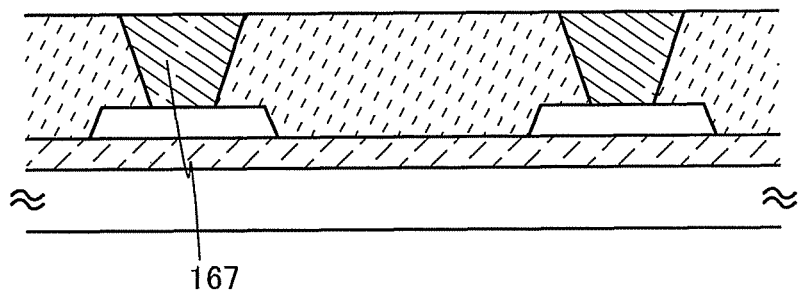

After that, a conductive film 167 is formed to fill the opening portion in the sacrifice layer 165 (FIG. 6B). The conductive film 167 can be formed in such a manner that a thick conductive film is formed by a sputtering method, an evaporation method, or the like and an upper portion thereof is removed by chemical mechanical polishing (CMP) treatment, for example. Alternatively, the conductive film 167 can be formed in such a manner that a seed layer is formed in a bottom portion of the opening portion in the sacrifice layer 165 and an electroplating method or a chemical plating method is employed. The seed layer can be foamed by a droplet discharging method or the like.

Figure 6C:
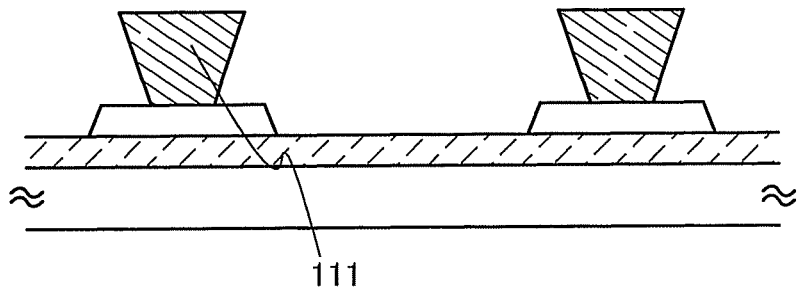

Next, the sacrifice layer 165 is removed, so that the auxiliary wiring 111 having the shape of the opening portion in the sacrifice layer 165 can be formed (FIG. 6C). The sacrifice layer 165 is preferably removed under the condition that the partition 109, the lower electrode layer 103, and the like which are in contact with the sacrifice layer 165 are not etched.

In the case where the auxiliary wiring includes two layers, such as the auxiliary wiring 131 illustrated in FIG. 3B or the auxiliary wiring 141 illustrated in FIG. 3C described in Embodiment 1, for example, a stage portion may be processed first and then a leg portion may be processed with the use of the stage portion as a mask, or the stage portion and the leg portion may be simultaneously processed by anisotropic etching and then additional etching may be performed so that a side surface of the leg portion is recessed. Alternatively, the leg portion may be processed first and then the stage portion may be formed. The method for manufacturing an auxiliary wiring having two or more layers can be selected as appropriate in accordance with materials used.

Further, in the case where the auxiliary wiring 151 is formed over the wiring 153 as illustrated in FIG. 3D, the partition 109 which covers the end portions of the lower electrode layer 103 and the wiring 153 and has an opening portion over the wiring 153 may be formed and the auxiliary wiring 151 may be formed in the opening portion in the partition 109. Here, in etching of a conductive film to be the auxiliary wiring 151, a method by which the wiring 153 is not completely removed is selected as appropriate.

Through the above steps, the auxiliary wiring 111 can be formed.

Figure 5D:
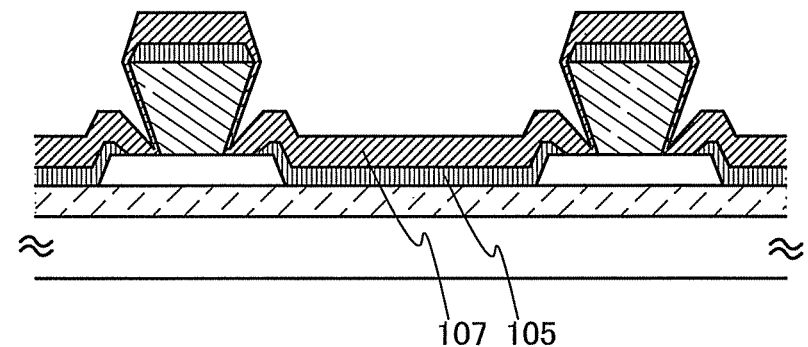

Next, the EL layer 105 and the upper electrode layer 107 are formed without a metal mask (FIG. 5D).

The EL layer 105 can be formed by an evaporation method. Here, the EL layer 105 is physically divided by the auxiliary wiring 111. An end portion of the EL layer 105 is formed in contact with the partition 109, and part of the EL layer 105 is formed over the auxiliary wiring 111.

The upper electrode layer 107 can be formed by an evaporation method or a sputtering method. In formation of the upper electrode layer 107, it is important that the upper electrode layer 107 is formed in contact with at least part of the side surface of the auxiliary wiring 111. In order that the upper electrode layer 107 is formed in contact with at least part of the side surface of the auxiliary wiring 111, the upper electrode layer 107 is formed in such a manner that the distance between an evaporation source or a sputtering target and the substrate 101 is shortened, for example. For example, in the case where a magnetron sputtering method is used, the distance between a sputtering target and the substrate 101 may be set to greater than or equal to 5 mm and less than or equal to 200 mm, preferably greater than or equal to 30 mm and less than or equal to 150 mm when the sputtering target is provided at a position where the sputtering target faces the substrate 101. Further, as another method, film formation may be performed in such a manner that a sputtering target is displaced in a direction parallel to a surface of the substrate 101 from the position where the sputtering target faces the substrate 101, or that a surface of a sputtering target is tilted to the surface of the substrate 101. In the case where a mirrortron sputtering method is used, a film can be formed in contact with part of the side surface of the auxiliary wiring 111.

The upper electrode layer 107 formed in this manner is in contact with at least part of the side surface of the auxiliary wiring 111, so that the upper electrode layer 107 is electrically connected to the auxiliary wiring 111. Accordingly, a potential drop due to the resistance of the upper electrode layer 107 in light emission of the light-emitting device 100 can be suppressed.

The separation layer 115 may be fowled before the EL layer 105 is formed or before the upper electrode layer 107 is formed in the case where a plurality of light-emitting devices 100 is provided adjacent to each other and the separation layer 115 is provided to electrically isolate the light-emitting devices 100.

The separation layer 115 can be formed in the following manner, for example: a negative photosensitive organic resin is formed, and then light exposure and development are performed. At this time, light exposure is performed such that the intensity of light used in the light exposure becomes lower in a region closer to the substrate in a thickness direction; thus, the separation layer 115 can have an inversely tapered shape as illustrated in FIG. 2.

It is important that the separation layer 115 has a shape which allows the separation layer 115 to physically divide the upper electrode layer 107 in formation. For example, as compared to the shape of the auxiliary wiring 111, an upper portion of the separation layer 115 protrudes more in a direction parallel to the substrate or the separation layer 115 curves more inward, so that the upper electrode layer 107 can be prevented from being formed on at least the side surface of the separation layer 115 in formation.

The separation layer 115 may be a single layer as described above or a multilayer including two or more layers. In the case of a multilayer, the separation layer 115 may be formed using an insulating organic material and an insulating inorganic material in combination.

After that, a sealing film covering the upper electrode layer 107 is formed. With the sealing film, entry of an impurity such as water from the outside can be suppressed, so that the highly reliable light-emitting device 100 can be provided.

Through the above steps, the light-emitting device 100 can be manufactured. By the above manufacturing method, the light-emitting device 100 can be formed without a metal mask, so that a problem caused due to contact between a metal mask and a substrate does not occur and a highly reliable light-emitting device can be provided.

This embodiment can be combined with any of the other embodiments disclosed in this specification as appropriate.

(Embodiment 3)

In this embodiment, an example in which the auxiliary wiring described in any of the above embodiments is used in a display device including a plurality of pixel portions will be described with reference to FIGS. 7A and 7B.

Figure 7A:
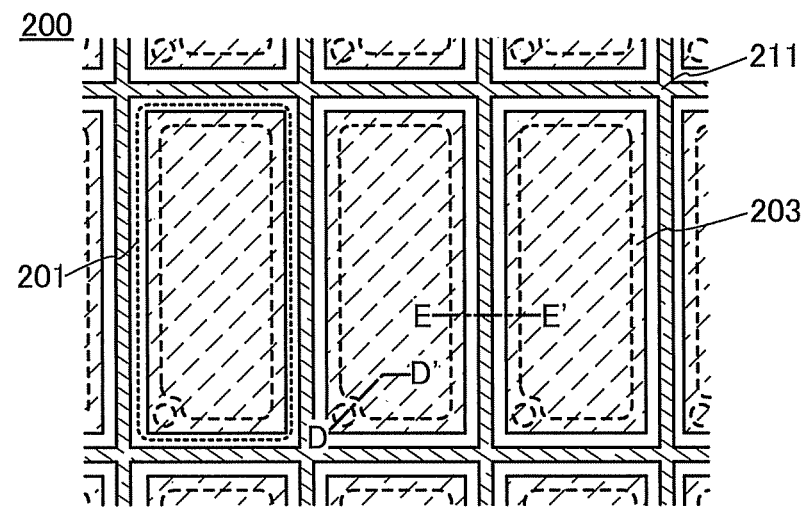
FIGS. 7A and 7B illustrate a display device according to an embodiment of the present invention.

FIG. 7A is a schematic top view of a display device 200 according to an embodiment of the present invention.

The display device 200 includes a plurality of pixel portions 201 arranged cyclically and an auxiliary wiring 211 surrounding the pixel portions 201. For simplicity, only a lower electrode layer 203, a light-emitting region over the lower electrode layer 203, which is surrounded by a dashed line, and a contact region indicated by a dashed circle are illustrated in the pixel portion in FIG. 7A.

Figure 7B:
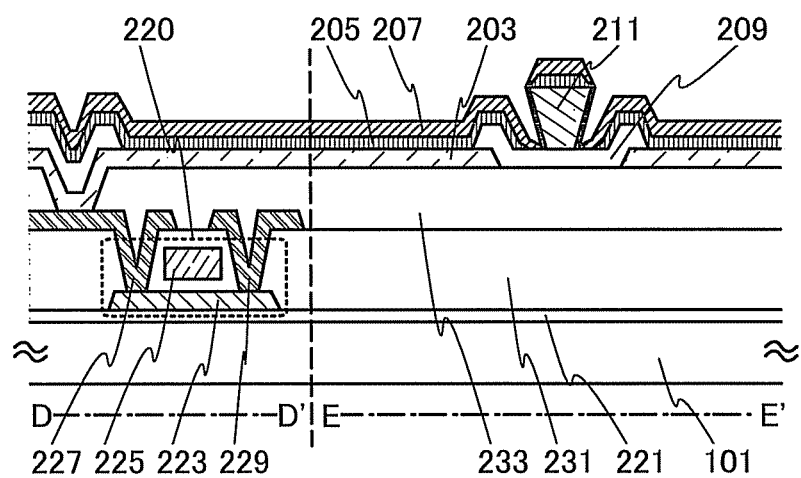

FIG. 7B is a schematic cross-sectional view taken along line D-D' and line E-E' in FIG. 7A. The cross section taken along line D-D' is a schematic cross-sectional view of a region including the contact region and a transistor 220 provided in the pixel portion 201. The cross section taken along line E-E' is a schematic cross-sectional view of a region including two adjacent pixel portions 201 and the auxiliary wiring 211 between the pixel portions 201.

The pixel portion 201 includes at least one transistor (transistor 220). The pixel portion 201 also includes the lower electrode layer 203 connected to the transistor 220 through the contact region, an EL layer 205, and an upper electrode layer 207. Further, a partition 209 covering an end portion of the lower electrode layer 203 and the contact region is provided.

Note that a sealing film covering at least the pixel portion 201 is preferably formed.

The transistor 220 is formed over the substrate 101 with a base film 221 interposed therebetween and includes a semiconductor layer 223 and a gate electrode 225. Further, a first electrode 227 is connected to one of a source and a drain provided in the semiconductor layer 223 through a contact hole formed in a first insulating layer 231 covering the transistor 220, and a second electrode 229 is connected to the other of the source and the drain through another contact hole formed in the first insulating layer 231 covering the transistor 220.

Further, the first electrode 227 is connected to the lower electrode layer 203 through a contact region provided in a second insulating layer 233 covering the transistor 220, the first electrode 227, the second electrode 229, and the first insulating layer 231. Accordingly, the transistor 220 is connected to the lower electrode layer 203.

Voltage or current supplied to the lower electrode layer 203 is controlled by switching operation of the transistor 220, and thus, light emission from the pixel portion 201 is controlled.

The auxiliary wiring 211 is formed over the partition 209 covering end portions of the lower electrode layers 203 of the two adjacent pixel portions 201, and at least part of a side surface of the auxiliary wiring 211 is in contact with the upper electrode layer 207. Accordingly, the upper electrode layers 207 included in the plurality of pixel portions 201 are electrically connected to each other through the auxiliary wiring 211.

Various modes of the auxiliary wirings described in the above embodiment can be used for the auxiliary wiring 211. The auxiliary wiring 211 may be formed over a wiring.

Note that the pixel portion 201 includes at least one transistor, and may include a plurality of transistors and a circuit element such as a capacitor depending on a driving method, a circuit structure, or the like of the display device 200.

The pixel portion 201 may be a top emission type, a bottom emission type, or a dual emission type; however, a top emission type is preferable because the aperture ratio in a light-emitting region can be increased. In the case of a bottom emission type or a dual emission type, a light-transmitting material is used as a material included in the transistor 220 (e.g., the semiconductor layer 223, the gate electrode 225, the first electrode 227, or the second electrode 229), whereby light emission can be efficiently obtained, which is preferable.

It is preferable that the color of light emitted from each of the pixel portions 201 be the same, more preferable a white color, and that the light be extracted through color filters overlapping with the pixel portions 201. The color filter may be formed over the substrate 101 or over a counter substrate. When the color of light emitted from each of the pixel portions 201 is the same, the EL layers 205 in the pixel portions 201 do not need to be formed separately and can be formed at one step without a metal mask.

In the case of a top emission type, a light path length adjustment film may be formed over the lower electrode layer 203 so that light emitted from the EL layer 205 and light reflected by the lower electrode layer 203 interfere with each other and light having a specific wavelength is strengthened. As the light path length adjustment film, a light-transmitting film which does not influence injection of carriers to the EL layer 205 is preferably used.

Note that the auxiliary wiring 211 of an embodiment of the present invention can be used as a common wiring provided so as to surround the display device 200. A potential to be applied to the upper electrode layer 207 is supplied to the common wiring. In the case where the auxiliary wiring 211 is used as a common wiring, for example, the auxiliary wiring 211 can be provided directly above a driver circuit portion controlling light emission of the plurality of pixel portions 201, which is connected to the display device 200. When the auxiliary wiring 211 used as a common wiring is provided directly above the driver circuit portion, the area of a contact portion between the driver circuit portion and the display device 200 can be reduced, which is preferable.

As described above, an auxiliary wiring of an embodiment of the present invention is used in a display device, whereby a potential drop due to the resistance of an upper electrode can be suppressed and a highly reliable display device can be provided. Further, an EL layer and an upper electrode can be formed without a metal mask, so that a problem caused due to contact between a metal mask and a substrate does not occur; thus, a highly reliable display device can be provided.

This embodiment can be combined with any of the other embodiments disclosed in this specification as appropriate.
(Embodiment 4)

In this embodiment, an example of a top-emission lighting device in which the light-emitting device described in Embodiment 1 is used will be described with reference to FIGS. 8A and 8B.

Figure 8A:
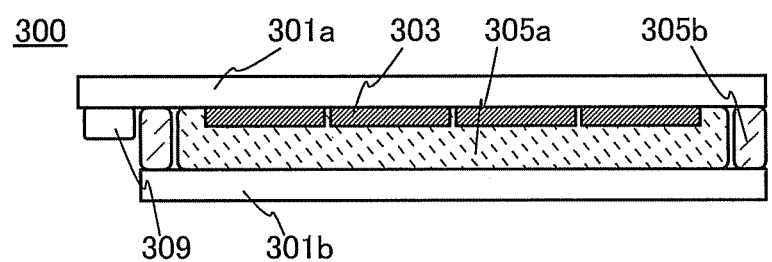
FIGS. 8A and 8B each illustrate a lighting device according to an embodiment of the present invention.

In a lighting device 300 illustrated in FIG. 8A, a plurality of light-emitting devices 303 is formed on a first substrate 301a. The first substrate 301a and a second substrate 301b having a light-transmitting property, which face each other, are attached to each other with a sealant 305a covering the light-emitting devices 303 and a sealant 305b provided at an end portion of the substrates.

Any of the light-emitting devices described in Embodiment 1 can be used as the light-emitting device 303 as appropriate.

It is preferable that a substrate having high thermal conductivity, such as a metal substrate, be used as the first substrate 301a. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

A light-transmitting substrate is used as the second substrate 301b. Uneven structures may be provided on a surface intersecting with light emitted from the light-emitting device 303, such as a surface of the light-emitting device 303 or top and bottom surfaces of the second substrate 301b in order to prevent total reflection. For example, a hemispherical lens, a microlens array, a film provided with an uneven structure, a light diffusing film, or the like may be attached, or an uneven structure may be directly formed.

As each of the sealants 305a and 305b, a material which can attach facing surfaces to each other can be used. For example, a known sealant formed of a thermosetting material, an ultraviolet curable material, or the like can be used. In particular, a light-transmitting material is preferably used for the sealant 305a. A material used for these is desirably a material which does not transmit moisture or oxygen as much as possible. In addition, a sealant containing a desiccating agent can also be used.

Figure 8B:
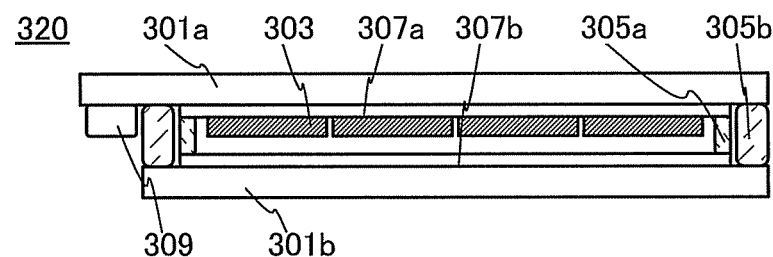

In a lighting device 320 illustrated in FIG. 8B, a structure in which a plurality of the light-emitting devices 303 formed on a first glass layer 307a is sealed with a second glass layer 307b is surrounded by the first substrate 301a and the second substrate 301b.

The first glass layer 307a and the second glass layer 307b are attached to each other with the sealant 305a. The first substrate 301a and the second substrate 301b are attached to each other with the sealant 305b.

Further, a space between the first glass layer 307a and the second glass layer 307b may be filled with a filler such as an inert gas (e.g., nitrogen or argon) or a sealant having a light-transmitting property.

Since the light-emitting devices 303 are sealed between two thin glass layers in the lighting device 320, an impurity such as moisture or oxygen can be prevented from entering from the outside, and thus, a highly reliable light-emitting device can be provided.

Further, each of the lighting devices 300 and 320 is provided with a converter 309, which is connected to the light-emitting devices 303, on the first substrate 301a. The converter 309 converts, for example, power supply voltage for home use into power supply voltage for driving the lighting device. Note that the converter 309 may be formed more on the inside than the sealant 305b.

Further, a material having flexibility, such as an organic resin, a thin glass substrate, or a metal thin film, is used as a material of the substrates used for the lighting devices 300 and 320, whereby the lighting device can be light and flexible.

Note that although a top-emission lighting device is described in this embodiment, in the case of a bottom-emission lighting device, for example, a substrate for which a light-emitting device is provided is preferably a light-transmitting substrate.

This embodiment can be combined with any of the other embodiments disclosed in this specification as appropriate.
(Embodiment 5)

In this embodiment, an example of an EL layer which can be applied to an embodiment of the present invention will be described with reference to FIGS. 9A to 9C.

Figure 9A:
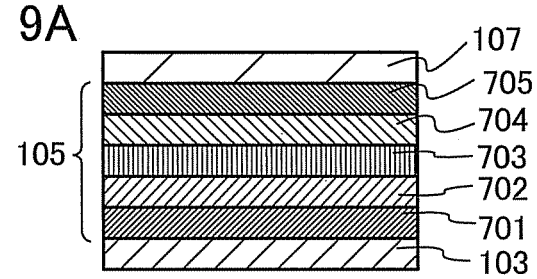
FIGS. 9A to 9C each illustrate an EL layer according to an embodiment of the present invention.

As illustrated in FIG. 9A, an EL layer 105 is provided between a first electrode 103 and a second electrode 107. The first electrode 103 and the second electrode 107 can have structures similar to those in the above embodiments.

The EL layer 105 includes at least a light-emitting layer containing a light-emitting organic compound. In addition, the EL layer 105 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the first electrode 103 side. Note that the stacking order may be inversed.

A manufacturing method of the light-emitting element illustrated in FIG. 9A will be described.

The hole-injection layer 701 is a layer that contains a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$) or copper(II) phthalocyanine (abbreviation: CuPc) can be used.

Any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3[N-(1-naphthyl)-N-(9-phenylcarbazol-3-yl)amino]-9-phenylcarbazole (abbreviation: PCzPCN1).

Any of high molecular compounds (e.g., oligomers, dendrimers, or polymers) can be used. As examples of the high molecular compounds, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like. A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, a composite material in which an acceptor substance is mixed with an organic compound having a high hole-transport property is preferably used for the hole-injection layer 701. With the use of the composite material in which an acceptor substance is mixed with a substance having a high hole-transport property, excellent hole injection from the first electrode 103 can be obtained, which results in a reduction in the driving voltage of the light-emitting element. Such a composite material can be formed by co-evaporation of a substance having a high hole-transport property and an acceptor substance. The hole-injection layer 701 is formed using the composite material, whereby hole injection from the first electrode 103 to the EL layer 105 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ $cm^2$/Vs or higher is preferably used. Note that any other substances may also be used as long as the hole-transport property thereof is higher than the electron-transport property thereof. Specific examples of the organic compounds that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Any of the following aromatic hydrocarbon compounds can also be used: 2-tert-butyl-9,10-di(2-naphthyl)anthracene (abbreviation: t-BuDNA), 2-tert-butyl-9,10-di(1-naphthyl)panthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Any of the following aromatic hydrocarbon compounds can also be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: $F_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

Note that the composite material may be Mimed using any of the above-described electron acceptor and any of the above high molecular compound such as PVK, PVTPA, PTPDMA, or Poly-TPD and may be used for the hole-injection layer 701.

The hole-transport layer 702 is a layer that contains a substance having a high hole-transport property. As the substance having a high hole-transport property, any of the following aromatic amine compounds can be used, for example: NPB, TPD, BPAFLP, 4,4'-bis[N-(9,9-dimethyl-fluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

A carbazole derivative such as CBP, CzPA, or PCzPA or an anthracene derivative such as t-BuDNA, DNA, or DPAnth may also be used for the hole-transport layer 702.

A high molecular compound such as PVK, PVTPA, PTPDMA, or Poly-TPD can also be used for the hole-transport layer 702.

For the layer 703 containing a light-emitting organic compound, a fluorescent compound which exhibits fluorescence or a phosphorescent compound which exhibits phosphorescence can be used.

As the fluorescent compound that can be used for the layer 703 containing a light-emitting organic compound, a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of the material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the material for yellow light emission include rubrene and 5,12-bis(1,1'-biphenyl-4-yl)-6,11-diphenyltetracene (abbreviation: BPT). Examples of the material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho [1,2-α]fluoranthene-3,10-diamine (abbreviation: p-mPhAFD).

As the phosphorescent compound that can be used for the layer 703 containing a light-emitting organic compound, a material for blue light emission, a material for green light emission, a material for yellow light emission, a material for orange light emission, and a material for red light emission are given. Examples of the material for blue light emission include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis [2-(4',6'-difluorophenyl)pyridinato-N,C$^{2'}$]iridium(III)acetylacetonate (abbreviation: FIr(acac)). Examples of the material for green light emission include tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of the material for yellow light emission include bis(2,4-diphenyl-1,3-oxazolato-N,C$^{2'}$)iridium(III) acetylacetonate (abbreviation: Ir(dpo)$_2$(acac)), bis{2-[4'-(perfluorophenylphenyl)]pyridinato-N,C$^{2'}$}iridium(III) acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis [2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of the material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of the material for red light emission include organometallic complexes such as bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris [1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the layer 703 containing a light-emitting organic compound may have a structure in which any of the above light-emitting organic compounds (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Specific examples of the host material include metal complexes such as tris(8-quinolinolato)aluminum(III) (abbreviation: Alq), tris(4-methyl-8-quinolinolato)aluminum (III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

Plural kinds of materials can be used as the host material. For example, in order to suppress crystallization, a substance, such as rubrene, which suppresses crystallization may be further added. In addition, NPB, Alq, or the like may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of a guest material can be suppressed.

A high molecular compound can be used for the layer 703 containing a light-emitting organic compound. Specifically, a material for blue light emission, a material for green light emission, and a material for orange to red light emission are given. Examples of the material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of the material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of the material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white-light emission can be obtained. This can be applied to a light-emitting element including three or more layers each containing a light-emitting organic compound.

The electron-transport layer 704 is a layer that contains a substance having a high electron-transport property. Examples of the substance having a high electron-transport property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Other examples include metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$). Besides, 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly ones that have an electron mobility of $10^{-6}$ cm$^2$/Vs or higher. Further, the electron-transport layer is not limited to a single layer and may be a stack of two or more layers containing any of the above substances.

The electron-injection layer 705 is a layer that contains a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 9B:
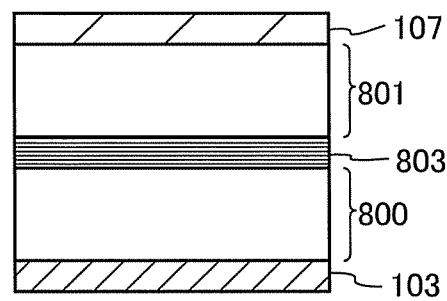

Note that a plurality of EL layers may be stacked between the first electrode 103 and the second electrode 107 as illustrated in FIG. 9B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer formed using the composite material and a layer formed using another material. In that case, a layer containing an electron donating substance and a substance having a high electron-transport property, a layer formed of a transparent conductive film, or the like can be used as the layer containing another material. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. This structure can be combined with any of the above structures of the EL layer.

Further, by forming EL layers to emit light of different colors from each other, a light-emitting element as a whole can provide light emission of a desired color. For example, by forming a light-emitting element having two EL layers such that the emission color of a first EL layer and the emission color of a second EL layer are complementary colors, the light-emitting element can provide white light emission as a whole. Note that the word "complementary" means color relationship in which an achromatic color is obtained when colors are mixed. That is, when complementary colored light emitted from substances is mixed, white-light emission can be obtained. This can be applied to a light-emitting element having three or more EL layers.

Figure 9C:
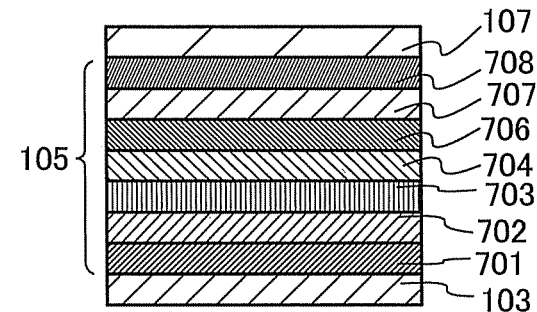

As illustrated in FIG. 9C, the EL layer 105 may include the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 107, between the first electrode 103 and the second electrode 107.

It is preferable to provide the composite material layer 708 which is in contact with the second electrode 107, in which case damage caused to the EL layer 105 particularly when the second electrode 107 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, or a compound of the above metal (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)) can be used.

In the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (e.g., an alkali metal compound (including an oxide such as lithium oxide, a halide, or a carbonate such as lithium carbonate or cesium carbonate), an alkaline earth metal compound (including an oxide, a halide, or a carbonate), or a rare earth metal compound (including an oxide, a halide, or a carbonate)). Note that as the substance having a high electron-transport property, a material similar to the material for the electron-transport layer 704 described above can be used.

Further, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the following is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

A phthalocyanine-based material is preferable as the metal complex having a metal-oxygen bond and an aromatic ligand. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that a phthalocyanine-based material having a phenoxy group is preferable as the phthalocyanine-based materials described above. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level higher than the acceptor level of the acceptor substance contained in the composite material layer 708 can be used as the substance having a high electron-transport property. Specifically, it is preferable to use a substance having a LUMO level of higher than or equal to −5.0 eV, preferably higher than or equal to −5.0 eV and lower than or equal to −3.0 eV. Examples of such a substance include a perylene derivative and a nitrogen-containing condensed aromatic compound. Note that a nitrogen-containing condensed aromatic compound is preferably used for forming the electron-relay layer 707 because of its stability.

Specific examples of the perylene derivative include 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

Specific examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''terthiophen (abbreviation: DCMT), a methanofullerene (e.g., [6,6]-phenyl C$_{61}$ butyric acid methyl ester), or the like can be used.

Note that in the case where a donor substance is contained in the electron-relay layer 707, the electron-relay layer 707 may be fowled by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above-described materials.

In the above manner, the EL layer 105 of this embodiment can be manufactured.

This embodiment can be combined with any of the other embodiments disclosed in this specification as appropriate.

(Embodiment 6)

In this embodiment, examples of a lighting device including a light-emitting device according to an embodiment of the present invention will be described, with reference to FIGS. 10A and 10B.

According to an embodiment of the present invention, a lighting device in which a light-emitting portion has a curved surface can be realized.

An embodiment of the present invention can be used for lighting in a car; for example, lighting can be provided for a dashboard, ceiling, or the like.

Figure 10A:
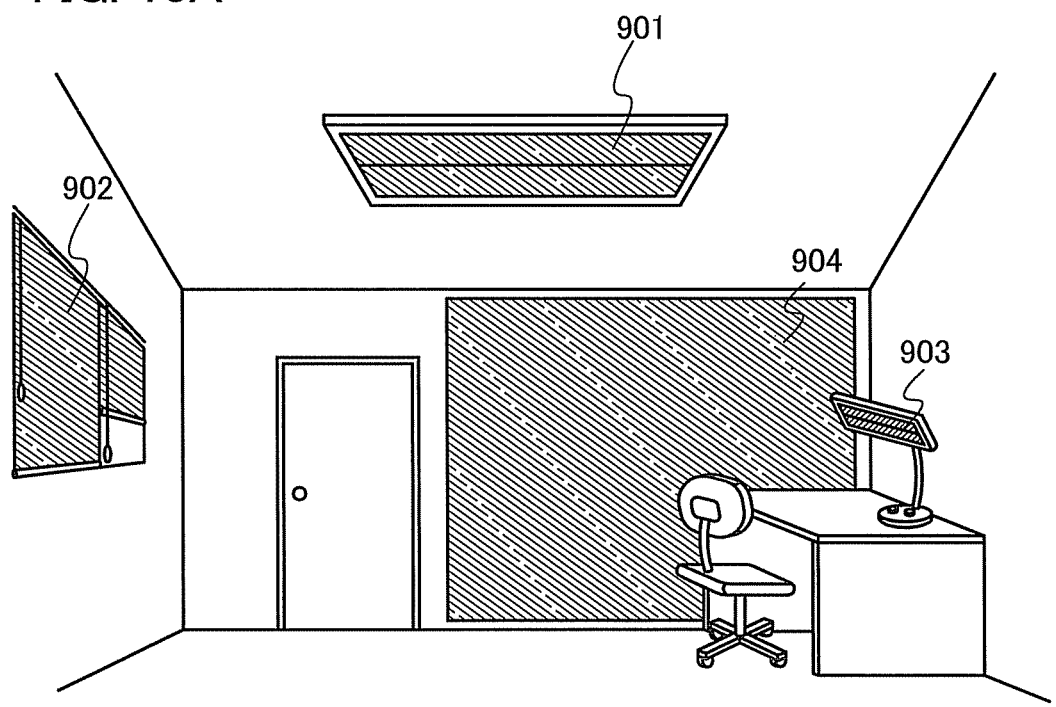
FIGS. 10A and 10B illustrate lighting devices according to embodiments of the present invention.

FIG. 10A illustrates an interior lighting device 901, a desk lamp 903, and a planar lighting device 904 to which an embodiment of the present invention is applied. Since the light-emitting device can have a larger area, it can be used as a lighting device having a large area. Further, since the light-emitting device is thin, the light-emitting device can be mounted on a wall. Furthermore, the light-emitting device can be used as a roll-type lighting device 902.

Figure 10B:
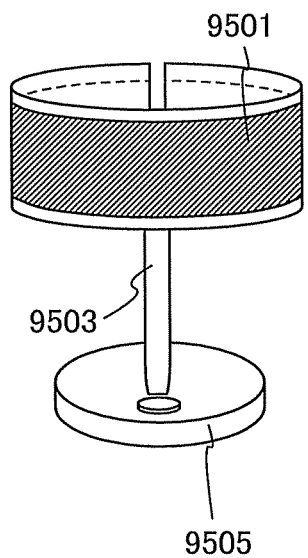

FIG. 10B illustrates another example of the lighting device. A desk lamp illustrated in FIG. 10B includes a lighting portion 9501, a support 9503, a support base 9505, and the like. The lighting portion 9501 includes a light-emitting device according to an embodiment of the present invention. According to an embodiment of the present invention, a lighting device having a curved surface or a lighting device including a flexible lighting portion can be realized in this manner. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be combined with any of the other embodiments disclosed in this specification as appropriate.

(Embodiment 7)

In this embodiment, semiconductor devices in which the light-emitting devices manufactured in the above embodiments are used will be described with reference to FIGS. 11A to 11C.

As a semiconductor device in which the light-emitting device manufactured in any of the above embodiments is used, a variety of electronic devices (including an amusement machine) can be given. Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

Figure 11A:
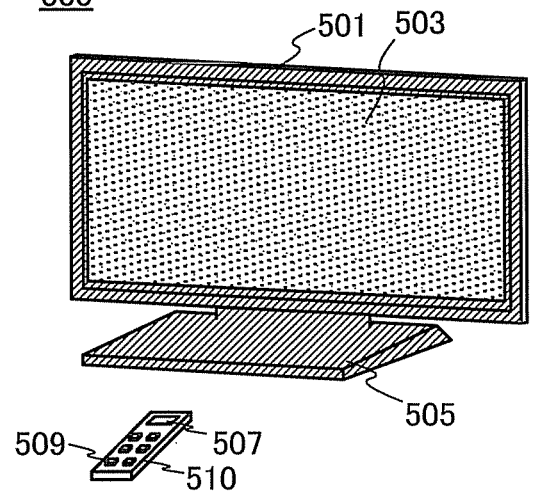
FIGS. 11A to 11C each illustrate a semiconductor device according to an embodiment of the present invention.

FIG. 11A illustrates an example of a television set. In a television set 500, a display portion 503 is incorporated in a housing 501. Images can be displayed on the display portion 503. Here, the housing 501 is supported by a stand 505.

The television set 500 can be operated by an operation switch of the housing 501 or a separate remote controller 510. Channels can be switched and volume can be controlled with operation keys 509 of the remote controller 510, whereby an image displayed on the display portion 503 can be controlled. The remote controller 510 may be provided with a display portion 507 for displaying data output from the remote controller 510.

Note that the television set 500 is provided with a receiver, a modem, and the like. With the use of the receiver, general television broadcasting can be received. Moreover, when the television set 500 is connected to a communication network with or without wires via the modem, one-way (from a sender to a receiver) or two-way (between a sender and a receiver or between receivers) information communication can be performed.

Figure 11B:
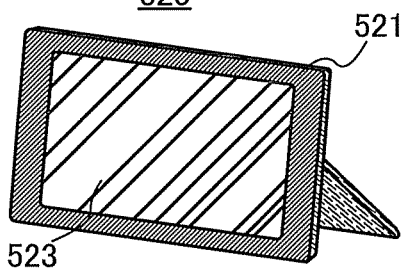

FIG. 11B illustrates an example of a digital photo frame. For example, a display portion 523 is incorporated in a housing 521 of a digital photo frame 520. The display portion 523 can display a variety of images. For example, the display portion 523 can display data of an image taken with a digital camera or the like and function as a normal photo frame.

Note that the digital photo frame 520 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 520. For example, a memory storing data of an image taken with a digital camera is inserted into the recording medium insertion portion of the digital photo frame and the image data is imported, whereby the imported image data can be displayed on the display portion 523.

The digital photo frame 520 may have a structure capable of wirelessly transmitting and receiving data. The structure may be employed in which desired image data is transferred wirelessly to be displayed.

Figure 11C:
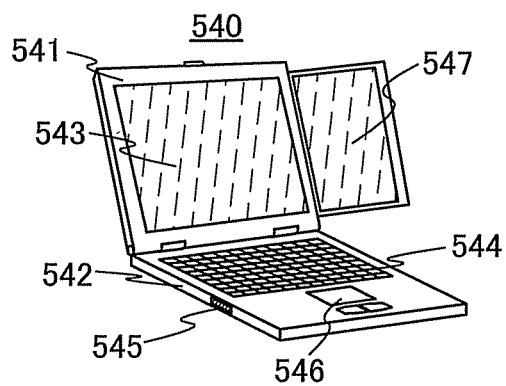

FIG. 11C is a perspective view illustrating an example of a portable computer.

In a portable computer 540 of FIG. 11C, a top housing 541 having a display portion 543 and a bottom housing 542 having a keyboard 544 can overlap with each other by closing a hinge unit which connects the top housing 541 and the bottom housing 542. The portable computer of FIG. 11C can be convenient for carrying, and in the case of using the keyboard for input, the hinge unit is opened and the user can input looking at the display portion 543.

The bottom housing 542 has a pointing device 546 with which input can be performed, in addition to the keyboard 544. When the display portion 543 is a touch screen, input can be performed by touching part of the display portion 543. The bottom housing 542 includes an arithmetic function portion such as a CPU or hard disk. In addition, the bottom housing 542 has an external connection port 545 into which another device, for example, a communication cable compliant with communication standards of a USB is inserted.

The top housing 541 further includes a display portion 547 which can be kept in the top housing 541 by being slid therein. Thus, a large display screen can be realized. In addition, the user can adjust the orientation of a screen of the display portion 547 which can be kept in the top housing 541. When the display portion 547 which can be kept in the top housing 541 is a touch screen, input can be performed by touching part of the display portion 547 which can be kept in the top housing 541.

In addition, the portable computer 540 in FIG. 11C can be provided with a receiver and the like and can receive television broadcasting to display an image on the display portion. The user can watch television broadcasting when the whole screen of the display portion 547 is exposed by sliding the display portion 547 and the angle of the screen is adjusted while the hinge unit which connects the top housing 541 and the bottom housing 542 is kept closed. In this case, the hinge unit is not opened and display is not performed on the display portion 543. In addition, start up of only a circuit for displaying television broadcasting is performed. Therefore, power consumption can be the minimum, which is useful for the portable computer whose battery capacity is limited.

The display device described in the above embodiment is used in a display portion of a semiconductor device such as an electronic device, whereby a highly reliable semiconductor device can be provided.

This embodiment can be combined with any of the other embodiments disclosed in this specification as appropriate.

EXPLANATION OF REFERENCE

100: light-emitting device, 101: substrate, 103: lower electrode layer, 105: EL layer, 107: upper electrode layer, 109: partition, 111: auxiliary wiring, 113: wiring, 115: separation layer, 117: auxiliary wiring, 119: partition, 121: auxiliary wiring, 131: auxiliary wiring, 131a: leg portion, 131b: stage portion, 141: auxiliary wiring, 141a: leg portion, 141b: stage portion, 151: auxiliary wiring, 153: wiring, 161: conductive film, 163: resist, 165: sacrifice layer, 167: conductive film, 171: auxiliary wiring, 171a: leg portion, 171b: stage portion, 175: connection layer, 181: auxiliary wiring, 181a: leg portion, 181b: stage portion, 183: lower electrode layer, 185: wiring, 200: display device, 201: pixel portion, 203: lower electrode layer, 205: EL layer, 207: upper electrode layer, 209: partition, 211: auxiliary wiring, 220: transistor, 221: base film, 223: semiconductor layer, 225: gate electrode, 227: first electrode, 229: second electrode, 231: first insulating layer, 233: second insulating layer, 300: lighting device, 301a: first substrate, 301b: second substrate, 303: light-emitting device, 305a: sealant, 305b: sealant, 307a: first glass layer, 307b: second glass layer, 309: converter, 320: lighting device, 500: television set, 501: housing, 503: display portion, 505: stand, 507: display portion, 509: operation key, 510: remote controller, 520: digital photo frame, 521: housing, 523: display portion, 540: computer, 541: upper housing, 542: lower housing, 543: display portion, 544: keyboard, 545: external connection port, 546: pointing device, 547: display portion, 701: hole-injection layer, 702: hole-transport layer, 703: layer containing light-emitting organic compound, 704: electron-transport layer, 705: electron-injection layer, 706: electron-injection buffer layer, 707: electron-relay layer,

708: composite material layer, 800: first EL layer, 801: second EL layer, 803: charge generation layer, 901: lighting device, 902: lighting device, 903: desk lamp, 904: planar lighting device, 9501: lighting portion, 9503: support, and 9505: support base.

This application is based on Japanese Patent Application serial no. 2011-027602 filed with Japan Patent Office on Feb. 10, 2011, the entire contents of which are hereby incorporated by reference.

The invention claimed is:

1. A light-emitting device comprising:
a transistor over a substrate;
a lower electrode layer over the transistor;
an insulating layer over and in direct contact with the lower electrode layer;
an auxiliary wiring over the insulating layer, wherein the auxiliary wiring is electrically isolated from the lower electrode layer;
an EL layer over the lower electrode layer and an upper surface of the insulating layer; and
an upper electrode layer over the EL layer and the insulating layer,
wherein the auxiliary wiring has conductivity,
wherein a bottom surface of the auxiliary wiring is in direct contact with a first surface of the insulating layer,
wherein the bottom surface is smaller than a projected area of the auxiliary wiring on the first surface,
wherein the upper electrode layer is electrically connected to the auxiliary wiring,
wherein the EL layer is in direct contact with the upper surface of the insulating layer in a cross-sectional view, and
wherein the upper electrode layer is in direct contact with the insulating layer and a side surface of the auxiliary wiring in the cross-sectional view.

2. The light-emitting device according to claim 1, wherein there is a space between the side surface of the auxiliary wiring and a line connecting an outermost point in a bottom portion of the auxiliary wiring and a most protruding point in a side portion of the auxiliary wiring.

3. The light-emitting device according to claim 1,
wherein the upper electrode layer transmits light emitted from the EL layer, and
wherein the lower electrode layer reflects the light.

4. A lighting device comprising the light-emitting device according to claim 1.

5. A display device comprising the light-emitting device according to claim 1.

6. A method for manufacturing a light-emitting device, comprising the steps of:
forming a transistor over a substrate;
forming a lower electrode layer over the transistor;
forming an insulating layer over and in direct contact with the lower electrode layer;
forming an auxiliary wiring having conductivity;
forming an EL layer over the lower electrode layer and an upper surface of the insulating layer; and
forming an upper electrode layer over the EL layer and the insulating layer,
wherein the upper electrode layer is electrically connected to the auxiliary wiring,
wherein a bottom surface of the auxiliary wiring is in direct contact with a first surface of the insulating layer,
wherein the bottom surface is smaller than a projected area of the auxiliary wiring on the first surface,
wherein the EL layer is in direct contact with the upper surface of the insulating layer in a cross-sectional view, and
wherein the upper electrode layer is in direct contact with the insulating layer and a side surface of the auxiliary wiring in the cross-sectional view.

7. A light-emitting device comprising:
a transistor over a substrate;
a first electrode layer over the transistor;
an insulating layer over and in direct contact with the first electrode layer;
an auxiliary wiring over the insulating layer;
an EL layer over the first electrode layer and an upper surface of the insulating layer; and
a second electrode layer over the EL layer,
wherein the auxiliary wiring has conductivity,
wherein a bottom surface of the auxiliary wiring is in direct contact with the insulating layer,
wherein an area of a top surface of the auxiliary wiring is larger than an area of the bottom surface of the auxiliary wiring,
wherein the second electrode layer is electrically connected to the auxiliary wiring,
wherein the EL layer is in direct contact with the upper surface of the insulating layer in a cross-sectional view, and
wherein the second electrode layer is in direct contact with the insulating layer and a side surface of the auxiliary wiring in the cross-sectional view.

8. The light-emitting device according to claim 7, wherein there is a space between the side surface of the auxiliary wiring and a line connecting an outermost point in a bottom portion of the auxiliary wiring and a most protruding point in a side portion of the auxiliary wiring.

9. The light-emitting device according to claim 7,
wherein the second electrode layer transmits light emitted from the EL layer, and
wherein the first electrode layer reflects the light.

10. A lighting device comprising the light-emitting device according to claim 7.

11. A display device comprising the light-emitting device according to claim 7.

12. The light-emitting device according to claim 6, wherein there is a space between the side surface of the auxiliary wiring and a line connecting an outermost point in a bottom portion of the auxiliary wiring and a most protruding point in a side portion of the auxiliary wiring.

13. The light-emitting device according to claim 6,
wherein the upper electrode layer transmits light emitted from the EL layer, and
wherein the lower electrode layer reflects the light.

14. A lighting device comprising the light-emitting device according to claim 6.

15. A display device comprising the light-emitting device according to claim 6.

* * * * *

UNITED STATES PATENT AND TRADEMARK OFFICE
CERTIFICATE OF CORRECTION

PATENT NO. : 9,577,209 B2
APPLICATION NO. : 13/367833
DATED : February 21, 2017
INVENTOR(S) : Yoshifumi Tanada et al.

It is certified that error appears in the above-identified patent and that said Letters Patent is hereby corrected as shown below:

In the Specification

Column 2, Line 58; Change "fowled" to --formed--.

Column 8, Line 1; Change "foamed" to --formed--.

Column 14, Line 8; Change "foamed" to --formed--.

Column 15, Line 13; Change "fowled" to --formed--.

Column 20, Line 35; Change "panthracene," to --anthracene,--.

Column 20, Line 66; Change "Mimed" to --formed--.

Column 24, Line 36; Change "tent" to --tert--.

Column 28, Line 9; Change "fowled" to --formed--.

Column 28, Line 23; Change "described, with" to --described with--.

In the Claims

Column 31, Lines 10 to 67, Claims 1 to 6; delete and replace with

--1. A light-emitting device comprising:
a lower electrode layer over and in direct contact with an insulating surface;
a wiring over and in direct contact with the insulating surface;
an insulating layer over and in direct contact with the lower electrode layer and the wiring;

Signed and Sealed this
Fourth Day of July, 2017

Joseph Matal
*Performing the Functions and Duties of the
Under Secretary of Commerce for Intellectual Property and
Director of the United States Patent and Trademark Office* an auxiliary wiring over and in direct contact with the wiring,
an EL layer over the lower electrode layer; and
an upper electrode layer over the EL layer,
wherein the auxiliary wiring is electrically isolated from the lower electrode layer,
wherein the auxiliary wiring has conductivity,
wherein a bottom surface of the auxiliary wiring is in direct contact with a first surface of the insulating layer,
wherein the bottom surface is smaller than a projected area of the auxiliary wiring on the first surface,
wherein the upper electrode layer is electrically connected to the auxiliary wiring,
wherein the EL layer is in direct contact with the first surface of the insulating layer in a cross-sectional view, and
wherein the upper electrode layer is in direct contact with the first surface of the insulating layer and a side surface of the auxiliary wiring in the cross-sectional view.

2. The light-emitting device according to claim 1, wherein there is a space between the side surface of the auxiliary wiring and a line connecting an outermost point in a bottom portion of the auxiliary wiring and a most protruding point in a side portion of the auxiliary wiring.

3. The light-emitting device according to claim 1,
wherein the upper electrode layer transmits light emitted from the EL layer, and
wherein the lower electrode layer reflects the light.

4. A lighting device comprising the light-emitting device according to claim 1.

5. A display device comprising the light-emitting device according to claim 1.

6. A method for manufacturing a light-emitting device, comprising the steps of:
forming a lower electrode layer and a wiring over and in direct contact with an insulating surface;
forming an insulating layer over and in direct contact with the lower electrode layer and the wiring;
forming an auxiliary wiring over and in direct contact with the wiring;
forming an EL layer over the lower electrode layer and an upper surface of the insulating layer; and forming an upper electrode layer over the EL layer and the insulating layer,
wherein the auxiliary wiring has conductivity,
wherein the auxiliary wiring is electrically isolated from the lower electrode layer,
wherein the upper electrode layer is electrically connected to the auxiliary wiring,
wherein a bottom surface of the auxiliary wiring is in direct contact with a first surface of the insulating layer,
wherein the bottom surface is smaller than a projected area of the auxiliary wiring on the first surface,
wherein the EL layer is in direct contact with the first surface of the insulating layer in a cross-sectional view, and wherein the upper electrode layer is in direct contact with the first surface of the insulating layer and a side surface of the auxiliary wiring in the cross-sectional view.--.

Column 32, Lines 1 to 67, Claims 7 to 15; delete and replace with

--7. A light-emitting device comprising:
a first electrode layer over and in direct contact with an insulating surface;
a wiring over and in direct contact with the insulating surface;
an insulating layer over and in direct contact with the first electrode layer and the wiring;
an auxiliary wiring over and in direct contact with the wiring;
an EL layer over the first electrode layer; and
a second electrode layer over the EL layer,
wherein the auxiliary wiring is electrically isolated from the first electrode layer,
wherein the auxiliary wiring has conductivity,
wherein a bottom surface of the auxiliary wiring is in direct contact with the insulating layer,
wherein an area of a top surface of the auxiliary wiring is larger than an area of the bottom surface of the auxiliary wiring,
wherein the second electrode layer is electrically connected to the auxiliary wiring,
wherein the EL layer is in direct contact with a first surface of the insulating layer in a cross-sectional view, and
wherein the second electrode layer is in direct contact with the first surface of the insulating layer and a side surface of the auxiliary wiring in the cross-sectional view.

8. The light-emitting device according to claim 7, wherein there is a space between the side surface of the auxiliary wiring and a line connecting an outermost point in a bottom portion of the auxiliary wiring and a most protruding point in a side portion of the auxiliary wiring.

9. The light-emitting device according to claim 7,
wherein the second electrode layer transmits light emitted from the EL layer, and
wherein the first electrode layer reflects the light.

10. A lighting device comprising the light-emitting device according to claim 7.

11. A display device comprising the light-emitting device according to claim 7.

12. The light-emitting device according to claim 6, wherein there is a space between the side surface of the auxiliary wiring and a line connecting an outermost point in a bottom portion of the auxiliary wiring and a most protruding point in a side portion of the auxiliary wiring.

13. The light-emitting device according to claim 6,
wherein the upper electrode layer transmits light emitted from the EL layer, and
wherein the lower electrode layer reflects the light.

14. A lighting device comprising the light-emitting device according to claim 6.

15. A display device comprising the light-emitting device according to claim 6.--.